(12) United States Patent
Boroson et al.

(10) Patent No.: US 6,226,890 B1
(45) Date of Patent: May 8, 2001

(54) DESICCATION OF MOISTURE-SENSITIVE ELECTRONIC DEVICES

(75) Inventors: Michael L. Boroson, Rochester; Jeffrey P. Serbicki, Holley; Peter G. Bessey, Clifton Springs, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/543,973

(22) Filed: Apr. 7, 2000

(51) Int. Cl.$^7$ .................................................. F26B 3/00
(52) U.S. Cl. ........................... 34/472; 34/474; 252/194; 501/32; 427/294
(58) Field of Search .................. 34/467, 468, 469, 34/472, 473, 474; 252/194; 501/32, 39, 80; 427/294, 372.2, 386

(56) References Cited

U.S. PATENT DOCUMENTS

| | | | |
|---|---|---|---|
| 3,308,558 | * | 3/1967 | Orlando .......................... 34/474 X |
| 4,013,566 | | 3/1977 | Taylor . |
| 4,022,560 | * | 5/1977 | Heinonen ........................ 34/80 X |
| 4,036,360 | | 7/1977 | Deffeyes . |
| 4,081,397 | | 3/1978 | Booe . |
| 4,974,337 | * | 12/1990 | Tavakoli et al. ................ 34/80 X |
| 5,304,419 | | 4/1994 | Shores . |
| 5,401,536 | | 3/1995 | Shores . |
| 5,581,903 | * | 12/1996 | Botich ............................. 34/264 |
| 5,591,379 | | 1/1997 | Shores . |
| 5,888,925 | * | 3/1999 | Smith et al. .................... 252/194 X |
| 5,910,450 | * | 6/1999 | Manns et al. .................. 34/472 X |
| 5,948,399 | * | 9/1999 | McGlothlin ..................... 34/472 X |

FOREIGN PATENT DOCUMENTS 0776147   5/1997  (EP) .

* cited by examiner

Primary Examiner—Stephen Gravini
(74) Attorney, Agent, or Firm—Raymond L. Owens

(57) ABSTRACT

A method of desiccating an environment surrounding a moisture-sensitive electronic device sealed within an enclosure, includes selecting a desiccant comprised of solid particles having a particle size range 0.1 to 200 micrometers, the desiccant selected to provide an equilibrium minimum humidity level lower than a humidity level to which the device is sensitive within the sealed enclosure; choosing a binder that maintains or enhances the moisture absorption rate of the desiccant for blending the selected desiccant therein, the binder being in liquid phase or dissolved in a liquid; forming a castable blend including at least the desiccant particles and the binder, the blend having a preferred weight fraction of the desiccant particles in the blend in a range of 10% to 90%; casting a measured amount of the blend onto a portion of an interior surface of an enclosure to form a desiccant layer thereover, the enclosure having a sealing flange; solidifying the desiccant layer to a solid; and sealing the electronic device with the enclosure along the sealing flange.

27 Claims, 4 Drawing Sheets

DESICCATION OF MOISTURE-SENSITIVE ELECTRONIC DEVICES

FIELD OF THE INVENTION

The present invention relates to control of moisture inside a packaged electronic device and relates particularly to improved desiccation of highly moisture-sensitive packaged electronic devices to prevent premature device failure or premature degradation of device performance.

BACKGROUND OF THE INVENTION

Various microelectronic devices require humidity levels in a range of about 2500 to below 5000 parts per million (ppm) to prevent premature degradation of device performance within a specified operating and/or storage life of the device. Control of the environment to this range of humidity levels within a packaged device is typically achieved by encapsulating the device or by sealing the device and a desiccant within a cover. Desiccants such as, for example, molecular sieve materials, silica gel materials, and materials commonly referred to as Drierite materials are used to maintain the humidity level within the above range.

Particular microelectronic devices, for example, organic light-emitting devices (OLED) or panels, polymer light-emitting devices, charge-coupled device (CCD) sensors, and micro-electro-mechanical sensors (MEMS) require humidity control to levels below about 1000 ppm and some require humidity control below even 100 ppm. Such low levels are not achievable with desiccants of silica gel materials and of Drierite materials. Molecular sieve materials can achieve humidity levels below 1000 ppm within an enclosure if dried at a relatively high temperature. However, molecular sieve materials have a relatively low moisture capacity at humidity levels at or below 1000 ppm, and the minimum achievable humidity level of molecular sieve materials is a function of temperature within an enclosure: moisture absorbed, for example, at room temperature, can be released into the enclosure or package during temperature cycling to higher temperature, such, as, for example, to a temperature of 100° C. Desiccants used within such packaged devices include metal oxides, alkaline earth metal oxides, sulfates, metal halides, or perchlorates, i.e. materials having desirably relatively low values of equilibrium minimum humidity and high moisture capacity. However, such materials often chemically absorb moisture relatively slowly compared to the above-mentioned molecular sieve, silica gel, or Drierite materials. Such relatively slow reaction with water vapor leads to a measurable degree of device degradation of performance following the sealing of the desiccant inside a device cover due to, for example, moisture absorbed on the inside of a device, moisture vapor present within the sealed device, and moisture permeating through the seal between the device and the cover from the outside ambient.

Some desiccants, particularly molecular sieve materials which entrain moisture by physical absorption within microscopic pores, require a dehydrating step at substantially elevated temperature prior to use within a device enclosure, thus increasing the number of process steps and calling for additional apparatus, such as, for example, a controllable furnace to achieve substantial dehydration.

Selection of a desiccant and the method of applying a selected desiccant to an inner portion of a device enclosure prior to sealing the device within or by the enclosure is governed by the type of device to be protected from moisture. For example, highly moisture-sensitive organic light-emitting devices or polymer light-emitting devices require the selection of particular desiccants and methods of application, since organic materials or organic layers are integral constituents of such devices. The presence of organic materials or layers may, for example, preclude the use of certain solvents or fluids in the application of a desiccant dispersed in a fluid to organic-based devices. Furthermore, a thermal treatment, if required, of a desiccant contained within a sealed device enclosure, needs to be tailored to the constraints imposed by thermal properties of the organic constituents or layers of the device. At any rate, release of solvent vapors during a thermal treatment of a desiccant disposed within a sealed device enclosure must be avoided or minimized if solvent vapors can adversely affect organic constituents of organic-based electronic devices. The aforementioned considerations pertaining to organic-based electronic devices may not be as important if the electronic device to be desiccated is strictly an inorganic or metallic device such as, for example, a MEMS device or a CCD sensor without an organic color filter overlay.

Numerous publications describe methods and/or materials for controlling humidity levels within enclosed or encapsulated electronic devices. For example, Kawami et al., European Patent Application EP 0 776 147 A1 disclose an organic EL element enclosed in an airtight container which contains a drying substance comprised of a solid compound for chemically absorbing moisture. The drying substance is spaced from the organic EL element, and the drying substance is consolidated in a predetermined shape by vacuum vapor deposition, sputtering, or spinner-coating.

Shores, U.S. Pat. No. 5,304,419 discloses a moisture and particle getter for enclosures which enclose an electronic device. A portion of an inner surface of the enclosure is coated with a pressure sensitive adhesive containing a solid desiccant.

Shores, U.S. Pat. No. 5,401,536 describes a method of providing a moisture-free enclosure for an electronic device, the enclosure containing a coating or adhesive with desiccant properties. The coating or adhesive comprises a protonated alumina silicate powder dispersed in a polymer.

Shores, U.S. Pat. No. 5,591,379 discloses a moisture gettering composition for hermetic electronic devices. The composition is applied as a coating or adhesive to the interior surface of a device packaging, and the composition comprises a water vapor permeable binder which has dispersed therein a desiccant which is preferably a molecular sieve material.

Many of the desiccants disclosed by Shores will not function effectively with highly moisture-sensitive devices at a humidity level lower than 1000 ppm.

Similarly, binders, such as polyethylene disclosed by Shores, that have low moisture absorption rates compared to the absorption rate of the pure selected desiccants would not function effectively to achieve and to maintain a humidity level below 1000 ppm during a projected operational lifetime of a highly moisture-sensitive device.

Deffeyes, U.S. Pat. No. 4,036,360 describes a desiccating material that is useful as a package insert or on the interior walls of packaging boxes for applications requiring only moderate moisture protection, such as film or cameras. The material comprises a desiccant and a resin having a high moisture vapor transmission rate.

The desiccants disclosed by Deffeyes are alumina, bauxite, calcium sulfate, clay, silica gel, and zeolite. None of these desiccants will function effectively with highly moisture-sensitive devices at a humidity level lower than 1000 ppm. In addition the moisture vapor transmission rate requirement for the resin is not adequately defined since there is no reference to the thickness of the measured resins. A material that transmits 40 grams per 24 hrs per 100 in$^2$ at a thickness of 1 mil would be very different than one that transmits 40 grams per 24 hrs per 100 in$^2$ at a thickness of 100 mils. It is therefore not possible to determine if the moisture vapor transmission rates disclosed by Deffeyes are sufficient for highly moisture-sensitive devices.

Taylor, U.S. Pat. No. 4,013,566 describes solid desiccant bodies that are useful as drier materials in refrigerant fluid systems. The solid desiccant body comprises finely divided particles of desiccant material bound in a moisture transmissive aliphatic epoxy polymer matrix.

The desiccants disclosed by Taylor are molecular sieves, activated alumina, and silica gel. None of these desiccants will function effectively with highly moisture-sensitive devices at a humidity level lower than 1000 ppm. In addition the moisture vapor transmission rate requirement for the resin is not adequately defined; stating only that the solid desiccant bodies have rates of adsorption of absorption comparable to the desiccant materials alone. It is therefore not possible to determine if the resins disclosed by Taylor are sufficient for highly moisture-sensitive devices.

Booe, U.S. Pat. No. 4,081,397 describes a composition used for stabilizing the electrical and electronic properties of electrical and electronic devices. The composition comprises alkaline earth oxides in an elastomeric matrix.

The desiccants disclosed by Booe are barium oxide, strontium oxide, and calcium oxide. These desiccants will function effectively with highly moisture-sensitive devices at humidity levels lower than 1000 ppm; however, Booe claims the elastomeric matrix has the property of retarding the rate of fluid absorption of the alkaline earth particles. In the examples the water absorption rate of the compositions are 5 to 10 times slower than the alkaline earth particles alone. This decrease in absorption rate is disclosed as a desirable feature that improves the handling of the highly reactive alkaline earth oxides. In highly moisture-sensitive devices, however, any decrease in the absorption rate of moisture will increase the likelihood of device degradation, and identification of resins that will increase the absorption rate of moisture would be highly desirable. For highly moisture-sensitive devices, therefore, it is important to determine the minimum allowable water vapor transmission rate of the binders used in combination with effective desiccant materials.

SUMMARY OF THE INVENTION

It is an object of the present invention to provide a method of desiccating an environment surrounding a highly moisture-sensitive electronic device sealed within an enclosure.

It is a further object of the present invention to provide a method of desiccating an environment surrounding a highly moisture-sensitive electronic device having at least one organic constituent layer, the device sealed within an enclosure.

It is another object of the present invention to provide a method of desiccating an environment surrounding a highly moisture-sensitive electronic device to be sealed within an enclosure wherein a desiccant layer is formed over an interior surface of an enclosure, the desiccant layer comprising solid desiccant particles in a moisture-permeable binder.

It is still another object of the present invention to provide a method of desiccating an environment surrounding a highly moisture-sensitive electronic device wherein a desiccant layer formed over an interior surface of a device enclosure comprises a solid desiccant having a low equilibrium minimum humidity, and a binder in which the solid desiccant is dispersed, the binder maintaining or enhancing the moisture absorption rate of the solid desiccant relative to the moisture absorption rate of the solid desiccant when used in the absence of such binder.

In one aspect, these and other objects are achieved by a method of desiccating an environment surrounding a moisture-sensitive electronic device sealed within an enclosure, comprising the steps of:

(a) selecting a desiccant comprised of solid particles having a particle size range 0.1 to 200 micrometers, the desiccant selected to provide an equilibrium minimum humidity level lower than a humidity level to which the device is sensitive within the sealed enclosure;

(b) choosing a binder that maintains or enhances the moisture absorption rate of the desiccant for blending the selected desiccant therein, the binder being in liquid phase or dissolved in a liquid;

(c) forming a castable blend comprised of at least the desiccant particles and the binder, the blend having a preferred weight fraction of the desiccant particles in the blend in a range of 10% to 90%;

(d) casting a measured amount of the blend onto a portion of an interior surface of an enclosure to form a desiccant layer thereover, the enclosure having a sealing flange;

(e) solidifying the desiccant layer to a solid; and (f) sealing the electronic device with the enclosure along the sealing flange.

The method in accordance with the present invention of desiccating an environment surrounding a highly moisture-sensitive electronic device sealed within an enclosure provides the following advantages over prior art methods: a moisture absorption rate that maintains or synergistically enhances the moisture absorption rate of a solid desiccant capable of providing a low equilibrium minimum humidity within the enclosure, by a binder in which the solid desiccant is dispersed; simple and reliable placement of a desiccant layer on an interior surface of a device enclosure; containment of solid desiccant particles by a binder within the device enclosure; thermally curable binders provide for removal of moisture trapped in an uncured desiccant layer by thermal curing of the layer; radiation-curable binders provide for fast curing of a desiccant layer by exposure to radiation; forming a desiccant layer on a separate adhesively bondable support provides for high speed, roll-to-roll manufacturing of a desiccant layer supply; and providing a desiccant layer having relatively low sensitivity of its desiccation efficacy to temperature cycling at elevated temperature up to 150° C.

DETAILED DESCRIPTION OF THE INVENTION

Figure 1:
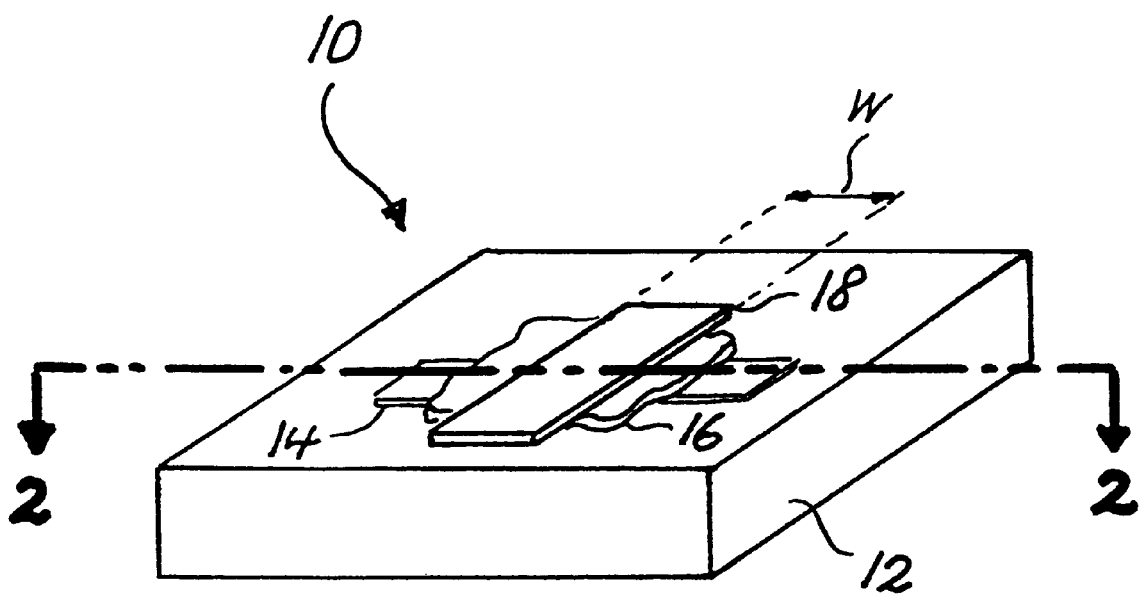
FIG. 1 is a schematic perspective view of an organic light-emitting device (OLED) test structure useful for testing the efficacy of a desiccant layer.
Figure 2:
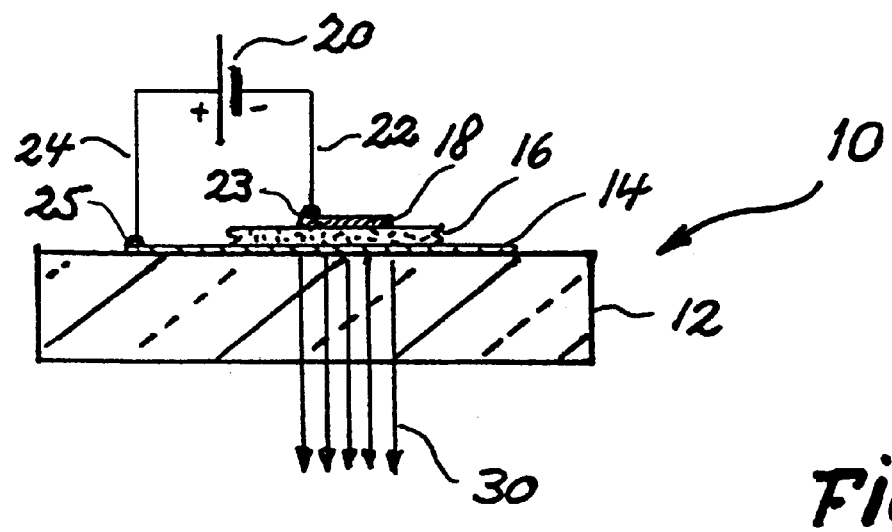
FIG. 2 is a schematic sectional view of the OLED test structure taken along section lines 2—2 of FIG. 1, and depicting emitted light upon application of an electrical potential across the test structure from a drive voltage supply.

Referring to FIG. 1 and FIG. 2, there are shown schematic perspective and sectional views of an organic light-emitting device (OLED) test structure 10 which has been found to be useful for testing the efficacy of a desiccant layer, since OLED devices in general are highly moisture-sensitive as evidenced by degradation of a cathode 18 when such a device is operated under ambient conditions of humidity. Details of the construction of the OLED test structure 10 are described under the heading "Experimental Procedures", Section I. Other test structures and test methods can be used, for example, so called "time-to-failure" testing of MEMS devices.

The OLED test structure 10 has a light-transmissive substrate 12 on which is disposed a light-transmissive anode 14. Over the anode 14 and over a portion of the substrate 12 is formed an organic light-emitting layer 16 which comprises at least two layers, namely, an organic hole-transporting layer in contact with the anode 14 and an organic electron-transporting layer in contact with the hole-transporting layer. A cathode 18 is formed in a direction orthogonal to the direction of the anode 14, and having a width dimension w which is a physical width dimension as well as representing an initial electrical width dimension, i.e. an electrical width dimension substantially identical with the physical width dimension w after fabrication and short-duration operation of the test structure 10. The operation of an unprotected OLED test structure 10 is schematically indicated in FIG. 2 wherein a drive voltage supply 20, depicted here as a battery, has its negative terminal connected to the cathode 18 via a lead 22 at a contact 23. The positive terminal of the drive voltage supply 20 is connected to the anode 14 via a lead 24 at a contact 25. The drive voltage supply 20 causes a current to flow through the OLED test structure 10 by injecting electrons into the organic light-emitting layer from the cathode 18, and by injecting holes from the anode 14. The electrons and the holes are transported across the electron-transporting layer (not shown) and the hole-transporting layer (not shown), and these charge carriers recombine at an interface between the electron- and hole-transporting layers, thereby generating emitted light 30 from an area of the OLED test structure which is congruent with the area of intersection between the anode 14 and the cathode 18 during initial operation of the test structure.

Figure 3A:
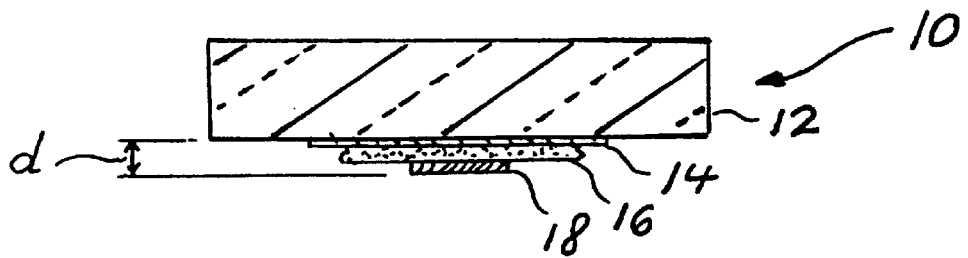
FIG. 3A shows the test structure of FIG. 2 in an inverted position, and defines a total thickness of the layers comprising the test structure.

Turning to FIG. 3A, the OLED test structure 10 is depicted in an inverted position, and a total thickness d of the anode 14, the organic light-emitting layer 16, and the cathode 18 is indicated. The thickness d may be in a range of 200 to 2000 nm.

Figure 3B:
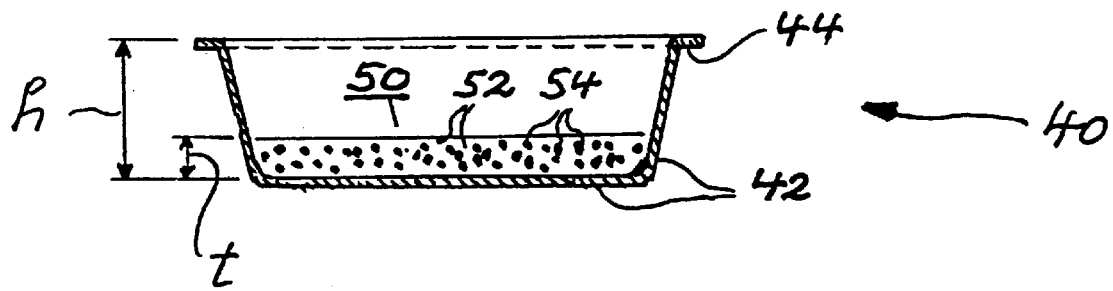
FIG. 3B depicts a sectional view of an enclosure for the test structure, the enclosure having a desiccant layer formed on a portion of an interior surface, with an enclosure height dimension and a desiccant layer thickness indicated.

Turning to FIG. 3B, there is depicted a sectional view of an enclosure 40 dimensioned to sealingly enclose at least the light-emitting portions of the OLED test structure 10. The enclosure 40 may be a metallic structure, a glass structure, a ceramic structure, or a plastic structure having a height dimension h. The enclosure can also comprise a combination of materials, such as, for example, a metallized plastic structure. The enclosure 40 has an exterior surface 42 comprising generally sloped side surfaces and a bottom surface not further identified. The enclosure 40 has a sealing flange 44 which will be used to seal the enclosure 40 against the substrate 12 of the test structure 10 to effectively enclose the test structure.

A desiccant layer generally indicated at 50 has a thickness t, and is shown disposed within the enclosure 40 and extending generally along a bottom portion of the surface 42. The desiccant layer 50 is comprised of a binder 52 and solid desiccant particles 54 dispersed or contained within the binder 52, as will be described in greater detail hereinafter.

Figure 4:
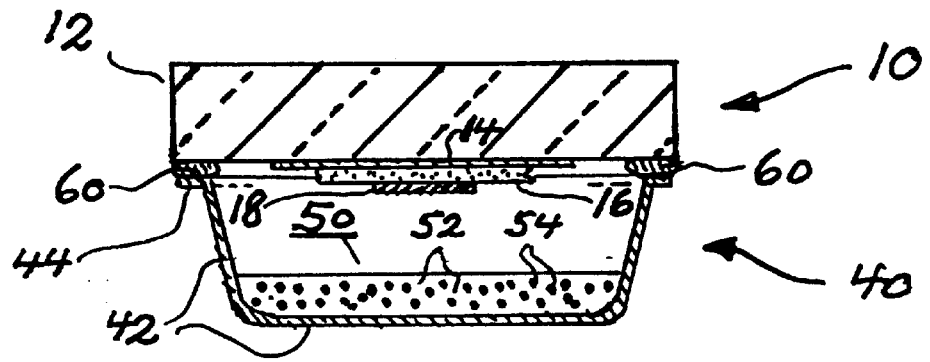
FIG. 4 shows in sectional view the OLED test structure of FIG. 3A, with the enclosure of FIG. 3B sealed to the test structure by a seal.

Turning to FIG. 4, the enclosure 40 containing the desiccant layer 50 is shown in sealing relationship with the OLED test structure 10 via a seal 60 which is formed between the sealing flange 44 of the enclosure and a perimeter portion of the substrate 12 so that the OLED test structure is enclosed, and the humidity level present in the OLED test structure 10, or present in the environment surrounding the OLED test structure (i.e. the environment between the OLED test structure and an upper surface of the desiccant layer 50) can be controlled by the desiccant layer 50.

The preparation of the desiccant layer 50 is as follows:

a desiccant comprised of solid desiccant particles is selected to provide an equilibrium minimum humidity level lower than a humidity level to which the OLED test structure is sensitive when sealingly enclosed by the enclosure 40 containing the desiccant layer;

the desiccant particles have a preferred particle size range of about 0.1 to about 200 micrometers;

a binder that maintains or enhances the moisture absorption rate of the desiccant is chosen for blending the selected desiccant therein;

the binder can be a monomer, an oligomer, or a polymer in a liquid phase, and alternatively, the binder is dissolved in a liquid (a solvent or solvents) so that a castable blend can be formed of the desiccant particles and the binder in a preferred weight fraction of the desiccant particles in the blend in a range of 10% to 90%;

a measured amount of the aforementioned blend is then cast on a portion of the lower interior surface of the enclosure 40, for example, by dispensing a measured amount of the blend from an automated dispensing nozzle until the dispensed liquid blend has spread along the lower surface of the enclosure to form a desiccant layer;

the layer is then cured to a solid, for example, by heating the layer under controlled conditions so as to remove residual solvents, until the cured layer has the desired desiccant layer thickness layer t.

Alternatively, if the moisture-absorption rate-enhancing binder is chosen to be radiation-curable or to be radiation-polymerizable, the curing step of the layer may include heating the layer while exposing the desiccant layer to curing radiation. Upon completion of the radiation-curing step to cure the desiccant layer to a solid, the enclosure 40 containing the cured desiccant layer 50 is sealed against the test structure 10 as described previously with reference to FIG. 4.

Currently preferred solid desiccants are selected from the group consisting of alkaline metal oxides, alkaline earth metal oxides, sulfates, metal chlorides, and perchlorates.

Currently preferred moisture-permeable binders are selected from the group consisting of cellulose acetates, epoxies, phenoxies, siloxanes, methacrylates, sulfones, phthalates, and amides.

Figure 5A:
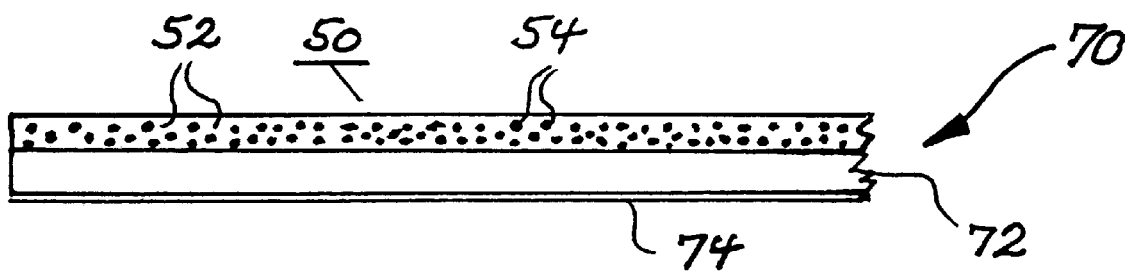
FIG. 5A depicts a desiccant layer assembly comprised of a desiccant layer formed over one surface of a support having an adhesively bondable opposing surface.

Turning to FIG. 5A, there is depicted a desiccant layer assembly 70 comprised of a desiccant layer 50 formed over one surface of a support 72 having on an opposing surface an adhesively bondable surface 74. The adhesively bondable surface 74 in practice is covered with a peelable protective layer (not shown). The desiccant layer assembly 70 can be prepared and cured in a so-called in-line coating and curing facility to provide an extensive supply of a desiccant layer 50 having a uniform layer thickness achievable by automated coating processes.

Figure 5B:
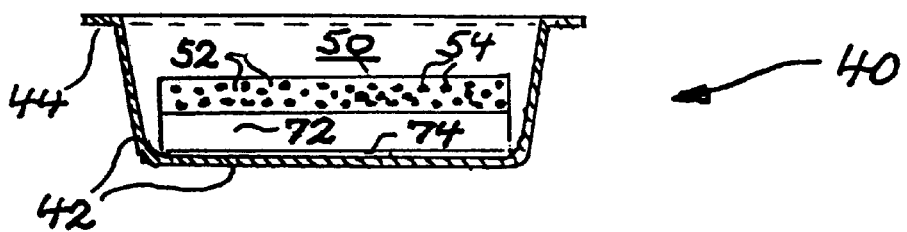
FIG. 5B shows an enclosure having a piece of the desiccant layer assembly of FIG. 5A adhesively bonded to a portion of an interior surface of the enclosure.

Turning to FIG. 5B, there is shown an enclosure 40 having a piece of the desiccant layer assembly 70 of FIG. 5A cut to an appropriate dimension and adhesively bonded to the lower portion of the interior surface of the enclosure.

Figure 6A:
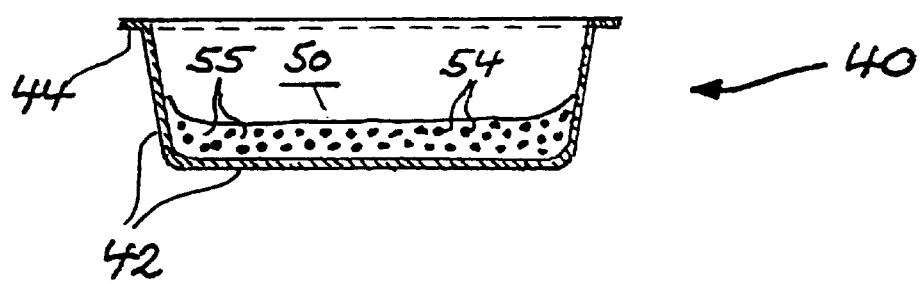
FIG. 6A shows an enclosure having a desiccant layer comprised of solid desiccant particles and a radiation-curable binder.

FIG. 6A shows an enclosure 40 having a desiccant layer 50 formed along a lower interior portion of the enclosure, the desiccant layer comprised of selected solid desiccant particles 54 dispersed in a radiation-curable binder 55. The binder 55 is selected to be moisture-permeable. Preferred moisture-permeable radiation-curable binders are preferably radiation-curable, commercially available photoresist compositions, or radiation-curable acrylates, methacrylates, cyclized polyisoprenes, polyvinyl cinnamates, epoxies, silicones, and adhesives.

Figure 6B:
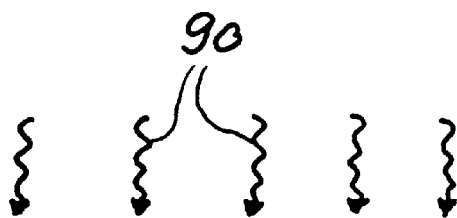
FIG. 6B indicates schematically curing radiation directed at the desiccant layer to cure the radiation-curable binder.
Figure 6B:
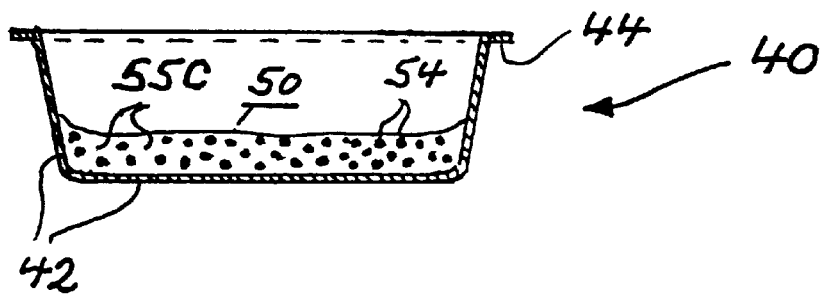

In FIG. 6B curing radiation 90 is shown directed to be incident on the desiccant layer 50 to provide for the curing or polymerization of the radiation-curable binder 55 in FIG. 6A, now designated as a radiation-cured binder 55c in FIG. 6B.

It will be appreciated that the desiccant layer 50 having the radiation-curable binder 55 can be formed as part of a desiccant layer assembly 70 as described with reference to FIG. 5A.

With the exception of choosing an organic radiation-curable binder, and with the exception of curing the binder by exposure to curing radiation, the preparation of a castable blend, and casting the blend to form a desiccant layer, are process steps substantially identical to the preparation steps described with reference to the description of FIG. 3B and FIG. 4, including the step of sealing the OLED test structure 10 with the enclosure 40 by the seal 60 (see FIG. 4).

As a general rule of practice in preparing a castable blend comprised of at least solid particles dispersed in a binder, care is taken to avoid the introduction of bubbles or other discontinuities in the blend. For example, it is well known that manufacturers of paints introduce into the paint blend various so-called leveling agents, surfactants, antifoam agents, and other addenda in order to provide a stable dispersion of paint pigment at a high paint pigment loading factor in a relatively viscous binder such as, for example, an acrylic binder. Such agents and addenda can be used advantageously in the preparation of castable blends of desiccant particles in a binder.

EXPERIMENTAL PROCEDURES

I. Construction of the OLED Test Structure of FIG. 1 and FIG. 2

A plurality of identical OLED test structures were fabricated by the following process sequence:

(1) a glass substrate having a light-transmissive anode of indium-tin-oxide (ITO) on one surface thereof was cleaned by ultrasonicating in a commercial detergent, rinsing in deionized water, degreasing in toluene vapor, and contacting by a strong oxidizing agent;

(2) a 150 nm thick organic hole-transporting layer of 4,4'-bis[N-(1-naphthyl)-N-phenylamino]biphenyl (NPB) was formed over the substrate and over the anode by conventional vacuum evaporation;

(3) a 75 nm thick organic electron-transporting layer of tris(8-quinolinato-N1,08)-aluminum (Alq) was formed over the NPB hole-transporting layer by conventional vacuum evaporation;

(4) a 200 nm thick aluminum cathode was formed over the Alq electron-transporting layer by vacuum evaporation of aluminum, through a shadow mask, so that the cathode was formed in a direction orthogonal to the anode, thereby defining an area of intersection between the anode and the cathode, and thus defining an area from which light would initially be emitted via electron-hole recombination at or near an interface between the Alq electron-transporting layer and the NPB hole-transporting layer.

II. Preparation and Sealing of Enclosures to OLED Test Structures (1) Each one of a plurality of suitably dimensioned enclosures (40; see, for example, FIGS. 3B, 5B, 6A, 6B) was cleaned, prior to forming a desiccant layer, by a cleaning process substantially identical to the substrate cleaning process described in Section I above, except that the step of contacting by a strong oxidizing agent was deleted;

(2) A desiccant layer was formed and cured along a lower interior surface of the enclosure;

(3) A sealing material was used to form a bead of sealing material along an upper surface of the sealing flange of the enclosure;

(4) the flange with the bead was positioned, and pressed against, a peripheral sealing area of the OLED's substrate, and the seal was cured by either cooling of a hot melt adhesive or UV exposure for 2 minutes of UV radiation curable adhesives, thus enclosing the OLED test structure (see FIG. 4).

III. Testing of Enclosed OLED Test Structures (1) Three to five nominally identical OLED test structures, each sealed with an enclosure containing one and the same nominally identical desiccant layer, were tested to provide data related to performance and variance of performance of such sets of enclosed test structures;

(2) The initial physical and electrical width dimension w of the cathode was measured as follows:
 (i) the physical width dimension was determined by microscopy in a calibrated optical microscope;
 (ii) the initial effective electrical width dimension was determined during test structure in operation by applying a voltage from a drive voltage source between the cathode and the anode, and adjusted such that a current density of 20 mA/cm² was achieved in the area defined by the intersection of the anode with the cathode. The width dimension of the emitted light in a direction across the cathode provided a measure of an initial effective electrical cathode width dimension which was also measured by the calibrated microscope;

(3) Initial values of physical and electrical cathode width dimensions coincided within a deviation of about +10 micrometer;

(4) Each set of enclosed OLED test structures was then stored under dark conditions in an environment test chamber at 85° C. and 85% RH for at least 100 hours;

(5) The test structures were operated under conditions described in paragraph (ii) above to measure the effective electrical width dimension of the cathode(s) following storage in the environmental test chamber;

(6) depending on the efficacy of the desiccant layer formed within the enclosure of the OLED test structure, an effective electrical width dimension of the cathode was reduced more or less with respect to the initial cathode width dimension. The difference between the initial electrical (and physical) width dimension and the effective electrical cathode width dimension following storage in the environmental test chamber was tabulated for each set of test structures, and was taken as a measure of effectiveness of a particular blend of desiccant particles in a binder used to form a desiccant layer within an enclosure.

IV. EXAMPLES

Example 1

Pure desiccant powders were tested to determine their relative effectiveness in preventing cathode width shrinkage in the OLED test structure. The procedure described in the application was used to prepare the test structures except that the desiccant layers were the pure powders and they were held in place by a non-woven fabric membrane that was coated on one side with a pressure sensitive adhesive. The sealing material was a hot melt polyolefin that was melted at 150 C. on the 5 mm flange of the enclosure and then pressed against the substrate while it cooled. The results of testing after 500 hrs at 85° C./85% RH were:

| Desiccant Type | Cathode Width Shrinkage ($\mu$m) |
| --- | --- |
| Phosphorous Pentoxide | 0 |
| Calcium Oxide | 0–5 |
| Barium Oxide | 0–15 |
| Magnesium Perchlorate | 5–10 |
| Calcium Sulfate | 45–50 |
| Molecular Sieves | 50 |
| No Desiccant | 80–150 |

The results show that phosphorous pentoxide, calcium oxide, barium oxide, and magnesium perchlorate are the best performing desiccants as predicted by their very low equilibrium minimum humidity capabilities.

Example 2

Calcium oxide powder was compared to 30 wt % calcium oxide dispersed in cellulose acetate (Water Vapor Transmission Rate of 150 gm-mil/100 in²/day) and cast into a film. The powder was placed in the enclosure by the same method as Example 1. The film was secured in the enclosure using double sided pressure sensitive tape. The sealing material was a UV curable epoxy on the 2 mm flange that was exposed to 15 J/cm² of UV energy. The results after 835 hrs at 85° C./85% RH were:

| Desiccant Type | Cathode Width Shrinkage ($\mu$m) |
| --- | --- |
| Cellulose Acetate with CaO | 53 |
| Calcium Oxide | 73 |

The results show that calcium oxide dispersed in cellulose acetate and cast into a film outperforms the calcium oxide powder alone. This synergistic effect was not expected. The high water vapor transmission rate of the cellulose acetate was expected to result in equivalent performance for the calcium oxide powder and the dispersion of calcium oxide in cellulose acetate.

Example 3

Calcium oxide powder was compared to 37 wt % calcium oxide dispersed in a 30 wt % solution of phenoxy resin (Water Vapor Transmission Rate of 3.5 gm-mil/100 in²/day) in diethyladipate. The desiccant layer was formed on the interior surface of the enclosure and baked at 160° C. for 2 hrs to remove the diethyladipate. The powder was placed in the enclosure by the same method as Example 1. The sealing material and method was the same as Example 2. The results after 166 hrs at 85° C./85% RH were:

| Desiccant Type | Cathode Width Shrinkage ($\mu$m) |
| --- | --- |
| Phenoxy with CaO | 70 |
| Calcium Oxide | 25 |

The results show that a low water vapor transmission rate of the resin can decrease the effectiveness of the desiccant compared to the pure powder. This demonstrates the importance of matching the water vapor transmission rate, the desiccant, and the water absorption rate requirements to provide sufficient protection for highly moisture sensitive electronic devices.

Example 4

Calcium oxide powder was compared to 70 wt % calcium oxide dispersed in a UV curable acrylate (UV1) (Water Vapor Transmission Rate of 136 gm-mil/100 in²/day). The desiccant layer was formed on the interior surface of the enclosure and cured by exposure to 15 J/cm² of UV energy. The powder was placed in the enclosure by the same method as Example 1. The sealing material and method was the same as Example 2. The results after 460 hrs at 85° C./85% RH were:

| Desiccant Type | Cathode Width Shrinkage ($\mu$m) |
| --- | --- |
| UV acrylate (UV1) with CaO | 19 |
| Calcium Oxide | 27 |

The results show that calcium oxide dispersed a highly water permeable UV curable acrylate outperforms the calcium oxide powder alone. As in Example 2 this synergistic effect was again not expected. The high water vapor transmission rate of the UV curable acrylate acetate was expected to result in equivalent performance for the calcium oxide powder and the dispersion of calcium oxide in the UV curable acrylate.

Example 5

Calcium oxide, barium oxide, calcium sulfate, and calcium bromide powders were compared to the same desiccants dispersed in phenoxy resin. 11 vol % desiccant was dispersed in a 21 wt % solution of phenoxy resin and formed on the interior surface of the enclosure as in Example 3. The powder was placed in the enclosure by the same method as Example 1. The sealing material and method was the same as Example 2. The results after 146 hrs at 85° C./85% RH were:

| Desiccant Type | Cathode Width Shrinkage ($\mu$m) |
| --- | --- |
| Barium Oxide | 0 |
| Calcium Oxide | 26 |
| Calcium Bromide | 100 |
| Calcium Sulfate | 562 |
| Phenoxy with Barium Oxide | 11 |
| Phenoxy with Calcium Oxide | 50 |
| Phenoxy with Calcium Bromide | 133 |
| Phenoxy with Calcium Sulfate | 872 |

The results show again that calcium oxide and barium oxide are the best performing desiccants as predicted by their very low equilibrium minimum humidity capabilities. The results also show that a low water vapor transmission rate of the resin can decrease the effectiveness of all desiccants compared to the pure powders. However, the results also show that barium oxide in phenoxy still outperforms both the pure calcium oxide powder and the phenoxy with calcium oxide. This result demonstrates that the minimum resin water vapor transmission rate is dependent on the desiccant choice. This again demonstrates the importance of matching the water vapor transmission rate, the desiccant, and the water absorption rate requirements to provide sufficient protection for highly moisture sensitive electronic devices, and demonstrates the inability to predict performance of the desiccant and resin blend based solely on equilibrium minimum humidity capabilities and water vapor transmission rates.

Example 6

Blends of calcium oxide dispersed in polyethylmethacrylate (PEMA), polydiallylphthalate (PDAP), polysulfone (PSF), phenoxy and two UV curable acrylates (UV1 and UV2) were compared. 37 vol % desiccant was dispersed in 63 vol % of each resin after drying or curing of the mixture. For polyethylmethacrylate, polydiallylphthalate, polysulfone, and phenoxy mixtures the desiccant layer was formed on the interior surface of the enclosure as in Example 3. For the UV curable acrylates the desiccant layer was formed on the interior surface of the enclosure as in Example 4. The sealing material and method was the same as Example 2. The results after 146 hrs at 85° C./85% RH were:

| Desiccant Type | Resin Water Vapor Transmission Rate (gm-mil/100 in$^2$/day) | Cathode Width Shrinkage ($\mu$m) |
| --- | --- | --- |
| UV1 with Calcium Oxide | 136 | 26 |
| PEMA with Calcium Oxide | 28 | 23 |
| UV2 with Calcium Oxide | 15 | 20 |
| PDAP with Calcium Oxide | Not measured | 43 |
| Phenoxy with Calcium Oxide | 3.5 | 50 |
| PSF with Calcium Oxide | Not measured | 62 |

The results show that a resin water vapor transmission rate of greater than 3.5 gm-mil/100 in$^2$/day is required to prevent a decrease in the effectiveness of the calcium oxide compared to calcium oxide in resins with water vapor transmission rates of 15 to 136 gm-mil/100 in$^2$/day. This again demonstrates the importance of matching the water vapor transmission rate, the desiccant, and the water absorption rate requirements to provide sufficient protection for highly moisture sensitive electronic devices.

Example 7

Calcium oxide powder was compared to 45 wt % calcium oxide dispersed in polyamide. The desiccant layer was formed on the interior surface of the enclosure by melting the desiccant and resin mixture, dispensing the melt, and cooling to room temperature. The powder was placed in the enclosure by the same method as Example 1. The sealing material and method was the same as Example 2. The results after 146 hrs at 85° C./85% RH were:

| Desiccant Type | Cathode Width Shrinkage ($\mu$m) |
| --- | --- |
| Calcium Oxide | 24 |
| Polyamide with Calcium Oxide | 23 |

The result show that calcium oxide dispersed in a melt processable polyamide performs as well as the calcium oxide powder alone.

The present invention is particularly suitable for use with microelectronic devices which are highly moisture-sensitive. It prevents premature device failure or premature degradation of device performance. With certain microelectronic devices humidity levels should not be greater than 2500 ppm. With other devices such as organic light-emitting devices, they typically should have a humidity level no greater than 100 ppm.

The invention has been described in detail with particular reference to certain preferred embodiments thereof, but it will be understood that variations and modifications can be effected within the spirit and scope of the invention.

PARTS LIST

| | |
| --- | --- |
| 10 | organic light-emitting device (OLED) test structure |
| 12 | light-transmissive substrate |
| 14 | light-transmissive anode |
| 16 | organic light-emitting layer |
| 18 | cathode |
| W | physical and initial electrical width dimension of cathode |
| 20 | drive voltage supply |

-continued

PARTS LIST

| | |
|---|---|
| 22 | lead |
| 23 | contact to cathode |
| 24 | lead |
| 25 | contact to anode |
| 30 | emitted light |
| d | total thickness of anode, organic light-emitting layer, and cathode |
| 40 | enclosure for OLED test structure |
| 42 | exterior surfaces of enclosure |
| 44 | sealing flange |
| h | height dimension of enclosure |
| 50 | desiccant layer |
| t | thickness of desiccant layer |
| 52 | binder |
| 54 | desiccant particles (dispersed in binder) |
| 55 | radiation-curable binder |
| 55c | radiation-cured binder |
| 60 | seal |
| 70 | desiccant layer assembly |
| 72 | support |
| 74 | adhesively bondable surface |
| 90 | curing radiation |
| 92 | heat radiation |

What is claimed is:

1. A method of desiccating an environment surrounding a moisture-sensitive electronic device sealed within an enclosure, comprising:

(a) selecting a desiccant comprised of solid particles having a particle size range 0.1 to 200 micrometers, the desiccant selected to provide an equilibrium minimum humidity level lower than a humidity level to which the device is sensitive within the sealed enclosure;

(b) choosing a binder that maintains or enhances the moisture absorption rate of the desiccant for blending the selected desiccant therein, the binder being in liquid phase or dissolved in a liquid;

(c) forming a castable blend including at least the desiccant particles and the binder, the blend having a preferred weight fraction of the desiccant particles in the blend in a range of 10% to 90%;

(d) casting a measured amount of the blend onto a portion of an interior surface of an enclosure to form a desiccant layer thereover, the enclosure having a sealing flange;

(e) solidifying the desiccant layer to a solid; and (f) sealing the electronic device with the enclosure along the sealing flange.

2. The method in accordance with claim 1 wherein the desiccant is selected from the group consisting of alkaline metal oxides, alkaline earth metal oxides, sulfates, metal halides, and perchlorates.

3. The method in accordance with claim 1 wherein the moisture absorption rate enhancing or maintaining binder is selected from the group consisting of cellulose acetates, epoxies, phenoxies, siloxanes, methacrylates, sulfones, phthalates, and amides.

4. The method in accordance with claim 1 wherein the selected desiccant particles have a particle size in a range of 0.1 to 10 micrometer.

5. The method in accordance with claim 1 wherein the castable blend has a weight fraction of the desiccant particles in the blend in a range of 40% to 90%.

6. The method of claim 1 wherein the moisture-sensitive electronic device requires a humidity level less than 2500 ppm.

7. The method of claim 1 wherein the moisture-sensitive electronic device is an organic light emitting device which requires a humidity level less than 100 ppm.

8. The method of claim 1 wherein water vapor transmission rate of the binder is greater than 3.5 gm-mil/100 in$^2$/day.

9. A method of desiccating an environment surrounding a moisture-sensitive electronic device sealed within an enclosure, comprising:

(a) selecting a desiccant including solid particles having a particle size range 0.1 to 200 micrometers, the desiccant selected to provide an equilibrium minimum humidity level lower than a humidity level to which the device is sensitive within the sealed enclosure;

(b) choosing a radiation-curable binder that maintains or enhances the moisture absorption rate of the desiccant for blending the selected desiccant therein, the radiation-curable binder being in liquid phase or dissolved in a liquid;

(c) forming a castable blend comprised of at least the desiccant particles and the radiation-curable binder, the blend having a preferred weight fraction of the desiccant particles in the blend in a range of 10% to 90%;

(d) casting a measured amount of the blend onto a portion of an interior surface of an enclosure to form a desiccant layer thereover, the enclosure having a sealing flange;

(e) curing the desiccant layer to a solid by exposing the layer to curing radiation selected to cure the radiation-curable binder; and (f) sealing the electronic device with the enclosure along the sealing flange.

10. The method in accordance with claim 9 wherein the desiccant is selected from the group consisting of alkaline metal oxides, alkaline earth metal oxides, sulfates, metal halides, and perchlorates.

11. The method in accordance with claim 9 wherein the moisture absorption rate enhancing or maintaining radiation-curable binder is selected from the group consisting of radiation-curable photoresist compositions.

12. The method in accordance with claim 9 wherein the moisture-absorption rate-enhancing radiation-curable binder is selected from the group consisting of acrylates, methacrylates, cyclized polyisoprenes, polyvinyl cinnamates, epoxies, silicones, and adhesives.

13. The method in accordance with claim 9 wherein the selected desiccant particles have a particle size in a range of 0.1 to 10 micrometer.

14. The method in accordance with claim 9 wherein the castable blend has a weight fraction of the desiccant particles in the blend in a range of 40% to 90%.

15. The method of claim 9 wherein the moisture-sensitive electronic device requires a humidity level less than 2500 ppm.

16. The method of claim 9 wherein the moisture-sensitive electronic device is an organic light emitting device which requires a humidity level less than 100 ppm.

17. The method of claim 9 wherein water vapor transmission rate of the binder is greater than 3.5 gm-mil/100 in$^2$/day.

18. A method of desiccating an environment surrounding a moisture-sensitive electronic device sealed within an enclosure, comprising:

(a) selecting a desiccant including solid particles having a particle size range, the desiccant selected to provide an equilibrium minimum humidity level lower than a humidity level to which the device is sensitive within the sealed enclosure;

(b) choosing a binder that maintains or enhances the moisture absorption rate of the desiccant for blending the selected desiccant therein, the binder being in liquid phase or dissolved in a liquid;

(c) forming a castable blend comprised of at least the desiccant particles and the binder, the blend having a weight ratio of the desiccant particles to the organic binder;

(d) casting the blend onto one surface of a support to form a desiccant layer thereover, an opposing surface of the support being an adhesively bondable surface;

(e) solidifying the desiccant layer to a solid;

(f) cutting a sized piece of the support and adhesively bonding the bondable surface to a portion on an interior surface of an enclosure, the enclosure having a sealing flange; and (g) sealing the electronic device with the enclosure along the sealing flange.

19. The method in accordance with claim 18 wherein the desiccant is selected from the group consisting of alkaline metal oxides, alkaline earth metal oxides, sulfates, metal halides, and perchlorates.

20. The method in accordance with claim 18 wherein the moisture absorption rate enhancing or maintaining binder is selected from the group consisting of cellulose acetates, epoxies, phenoxies, siloxanes, methacrylates, sulfones, phthalates, and amides.

21. The method in accordance with claim 18 wherein the selected desiccant particles have a particle size in a range of 0.1 to 10 micrometer.

22. The method in accordance with claim 18 wherein the castable blend has a weight fraction of the desiccant particles in the blend in a range of 40% to 90%.

23. The method in accordance with claim 18 wherein the moisture absorption rate enhancing or maintaining binder is a radiation-curable binder selected from the group consisting of radiation-curable photoresist compositions.

24. The method in accordance with claim 18 wherein the radiation-curable binder is selected from the group consisting of acrylates, methacrylates, cyclized polyisoprenes, polyvinyl cinnamates, epoxies, silicones, and adhesives.

25. The method of claim 18 wherein the moisture-sensitive electronic device requires a humidity level less than 2500 ppm.

26. The method of claim 18 wherein the moisture-sensitive electronic device is an organic light emitting device which requires a humidity level less than 100 ppm.

27. The method of claim 18 wherein water vapor transmission rate of the binder is greater than 3.5 gm-mil/100 in$^2$/day.

* * * * *